United States Patent
Kunysz

(10) Patent No.: US 6,452,560 B2
(45) Date of Patent: Sep. 17, 2002

(54) SLOT ARRAY ANTENNA WITH REDUCED EDGE DIFFRACTION

(75) Inventor: Waldemar Kunysz, Calgary (CA)

(73) Assignee: NovAtel, Inc., Calgary (CA)

( * ) Notice: Subject to any disclaimer, the term of this patent is extended or adjusted under 35 U.S.C. 154(b) by 0 days.

(21) Appl. No.: 09/732,849

(22) Filed: Dec. 8, 2000

Related U.S. Application Data

(63) Continuation-in-part of application No. 09/375,319, filed on Aug. 16, 1999.

(51) Int. Cl.⁷ .............................................. H01Q 13/10
(52) U.S. Cl. ....................................... 343/770; 343/769
(58) Field of Search ........................... 343/700 MS, 767, 343/768, 769, 770, 895, 909; H01Q 1/38, 9/36, 13/10, 9/38

(56) References Cited

U.S. PATENT DOCUMENTS

| | | | |
|---|---|---|---|
| 3,568,206 A | * | 3/1971 | Sisson ......................... 343/750 |
| 3,665,480 A | * | 5/1972 | Fassett ........................ 343/754 |
| 3,696,433 A | * | 10/1972 | Killion et al. ............... 343/770 |
| 4,150,383 A | * | 4/1979 | Andersson et al. ......... 343/771 |
| 4,204,212 A | | 5/1980 | Sindoris et al. |
| 4,315,266 A | | 2/1982 | Ellis, Jr. |
| 4,477,814 A | | 10/1984 | Brumbaugh et al. |
| 4,525,720 A | | 6/1985 | Corzine et al. |
| 4,608,572 A | * | 8/1986 | Blakney et al. ........... 343/792.5 |
| 4,658,262 A | | 4/1987 | DuHamel |
| 5,220,340 A | | 6/1993 | Shafai |
| 5,313,216 A | | 5/1994 | Wang et al. |
| 5,402,136 A | * | 3/1995 | Goto et al. ................. 343/729 |
| 5,451,973 A | | 9/1995 | Walter et al. |
| 5,614,863 A | | 3/1997 | Pierro et al. |
| 5,621,422 A | | 4/1997 | Wang |
| 5,646,633 A | | 7/1997 | Dahlberg |
| 5,712,647 A | | 1/1998 | Shively |
| 5,815,122 A | | 9/1998 | Nurnberger et al. |
| 5,861,848 A | | 1/1999 | Iwasaki |
| 5,929,825 A | | 7/1999 | Niu et al. |
| 5,936,594 A | | 8/1999 | Yu et al. |

OTHER PUBLICATIONS

Nurenberger M W et al.: "A New Planar Feed For Slot Spiral Antennas" IEEE Transactions on Antennas and Propagation, US, IEEE Inc. New York, vol. 44, No. 1, 1996, pp. 130–131 XP000549415.

* cited by examiner

*Primary Examiner*—Tho Phan
(74) *Attorney, Agent, or Firm*—Cesari and McKenna, LLP

(57) ABSTRACT

A slot-array antenna includes a nonconductive substantially planar substrate and a transmission line disposed on a rear substrate surface where one end of the transmission line is connected to an amplifier, a connector, or an impedance load. A conductive layer on the front substrate surface includes a plurality of slotted openings arrayed about an antenna axis. A surface-wave suppression region encloses the array of slotted openings and a plurality of peripheral openings are disposed between the surface-wave suppression region and the peripheral edge of the antenna.

25 Claims, 4 Drawing Sheets

FIG. 4 is an alternative embodiment of the antenna of FIG. 1 which includes a reflector and RF absorbing material.

SLOT ARRAY ANTENNA WITH REDUCED EDGE DIFFRACTION

CROSS-REFERENCE TO RELATED APPLICATIONS

The present application is a continuation-in-part of commonly-assigned copending U.S. patent application Ser. No. 09/375,319, which was filed on Aug. 16, 1999, by W. Kunysz for an Aperture Coupled Slot Array Antenna.

BACKGROUND OF THE INVENTION

1. Field of the Invention

The present invention is related to planar broadband antennas and, more particularly, to an antenna with reduced edge diffraction.

2. Background Information

Antennas, such as used in Global Positioning Systems (GPS), have differing requirements depending upon the particular application for the antenna. For application to surveying activity, for example, the ideal antenna will receive only those signals originating above the horizontal plane of the antenna, and reject all other signals. Additionally, the ideal antenna will have a known and stable phase center located at the geometric center of the antenna, and have perfect circular polarization characteristics to maximize the reception of incoming right-hand polarized signals. A close approximation to such an ideal antenna can be provided by a patch antenna mounted on a choke ring ground plane. However, such a configuration is large and bulky, prohibiting its use in portable applications such as surveying.

Furthermore, many antenna radiation structures exhibit performance degradation as a result of surface wave excitation at the front surface of the antenna which produces diffractive radiation at the antenna edge. It is thus an object of the present invention to provide a slot array antenna antenna with reduced edge diffraction.

Other objects of the invention will be obvious, in part, and, in part, will become apparent when reading the detailed description to follow.

SUMMARY OF THE INVENTION

A slot-array antenna includes a nonconductive substantially planar substrate, a transmission line disposed on a rear substrate surface, and a conductive layer on the front antenna surface, the conductive layer having an array of slotted openings therein. When an electromagnetic signal is fed into one end of the transmission line and sequentially coupled into the slotted openings, a corresponding signal is emitted from the antenna substantially in the direction of the antenna axis. The front antenna surface also includes a surface wave suppression region enclosing the slotted array and a plurality of through holes disposed between the wave suppression region and the peripheral edge of the antenna to reduce diffraction of the emitted signal at the peripheral edge.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
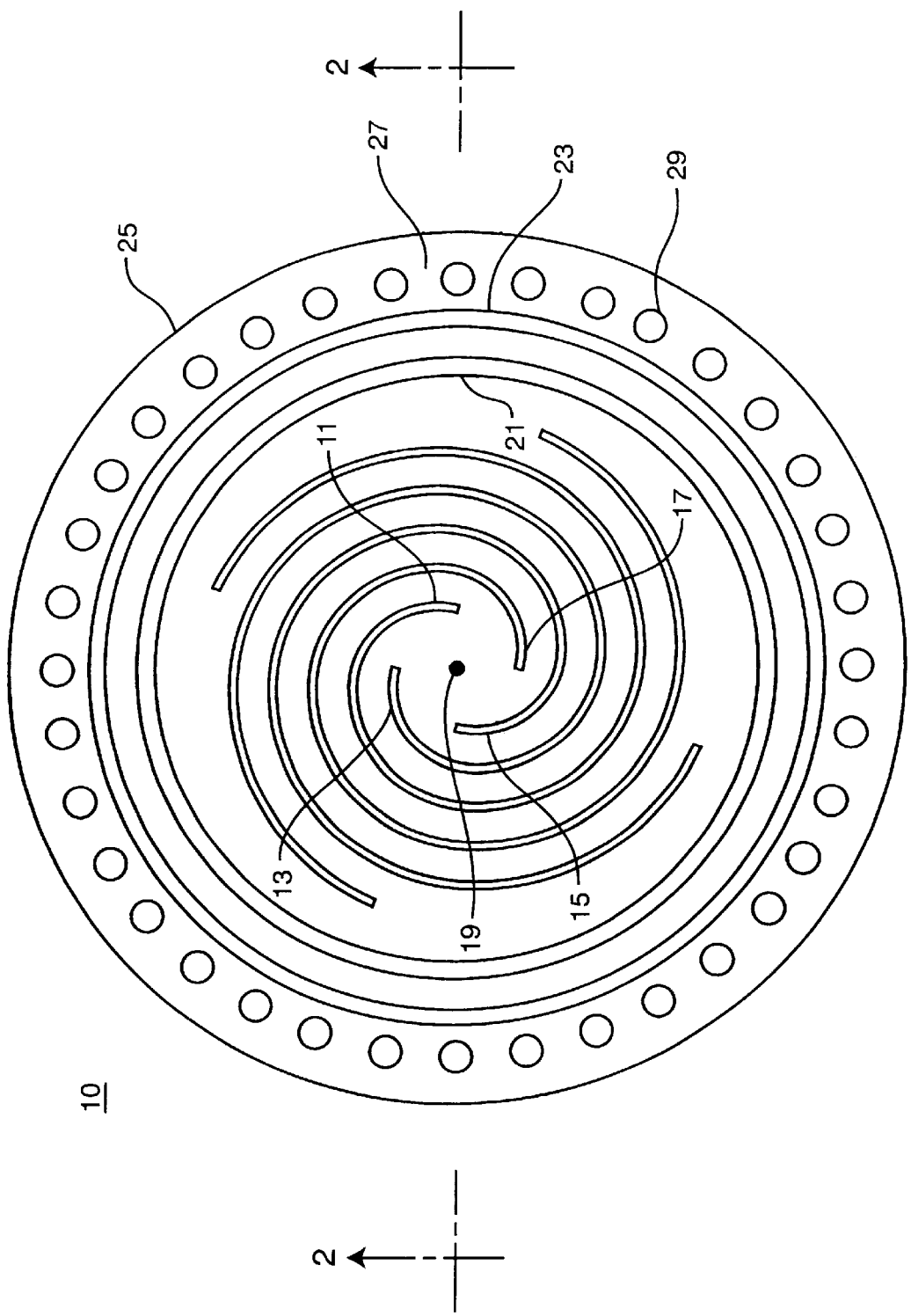
FIG. 1 is a diagrammatical view of the front surface of a slot array antenna in accordance with the present invention.

FIG. 1 is a diagrammatical view showing the front side of a substantially planar slot-array antenna 10 for receiving or transmitting electromagnetic signals of wavelength $\lambda$, in accordance with the present invention. The antenna 10 includes a plurality of curved, slotted openings 11, 13, 15, and 17 which may be of equal lengths, as shown, or of different lengths as a particular application may require. The slotted openings 11, 13, 15, and 17 are arrayed about an antenna axis 19, or phase center. In the example provided, a first, substantially circular surface wave suppression feature 21 encloses the array of slotted openings 11, 13, 15, and 17, and a second substantially circular wave suppression feature 23 encloses the first wave suppression feature 21. The wave suppression features 21 and 23 define a surface-wave suppression region 27. A plurality of peripheral openings 29, or through holes, are distributed around the surface-wave suppression region 27 and inside a peripheral edge 25 of the antenna 10 as shown.

It should be understood that a relatively small number of slotted openings, wave suppression features, and peripheral openings are shown in Fig. limited for clarity of illustration, and that the disclosed invention is not restricted to the particular configuration shown. A preferred embodiment, for example, includes an array of twelve equal-length slotted openings, a series of eleven concentric wave suppression features in the surface-wave suppression region, and a distribution of one hundred twelve peripheral openings, all disposed within a diameter of approximately 6.25 inches. The quantity and spacing of the concentric wave suppression features are such that there are three or more, and preferably ten, such features within a radial dimension of approximately one wavelength $\lambda$.

Figure 2:
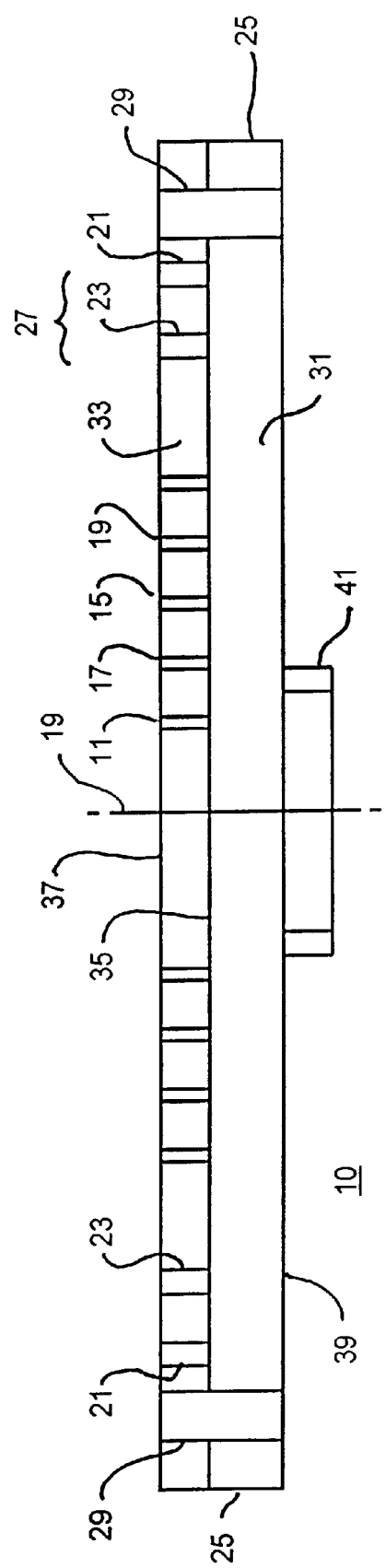
FIG. 2 is a cross sectional view of the antenna of FIG. 1.

FIG. 2 is a diagrammatical cross-sectional view of the antenna 10 as indicated by the sectional arrows in FIG. 1. The antenna 10 comprises a substrate 31 of a dielectric, or other nonconductive material, and a conductive layer 33 disposed on a front surface 35 of the substrate 31, where the front surface 35 is bounded by the peripheral edge 25. As can be seen in cross-section, each slotted opening 11, 13, 15, and 17 extends from a front surface 37 of the conductive layer 33, through the conductive layer 33, to the front surface 35 of the substrate.

The surface-wave suppression region 27 comprises a photonic-bandgap (PBG) material disposed in the conductive layer 33. As is known in the relevant art, a PBG material is a class of periodic dielectrics, where the periodicity may be one-, two-, or three-dimensional. For example, the surface-wave suppression region 27 may include a special texture (not shown) etched in the conductive layer 33 to provide a high impedance for radiation of wavelength $\lambda$. A relevant discussion of PBG material may be found in the cited reference by D. Sievenpiper et al. entitled "High-Impedance Electromagnetic Surfaces with a Forbidden Frequency Band."

In a preferred embodiment, a three-dimensional PBG material, or photonic crystal (PC) is used for the surface-wave suppression region 27. As seen in the sectional view, the wave suppression features 21 and 23 are configured as adjacent concentric grooves enclosing the slotted openings 11, 13, 15, and 17. Thus, the PBG material is formed by this series of concentric grooves disposed between the slotted openings 11, 13, 15, and 17 and the peripheral edge 25. Each groove extends between the front surface 37 and the front surface 35. The surface-wave suppression region 27 functions to attenuate or suppress surface waves propagating along the front surface 37 from the slotted openings 11, 13, 15, and 17 toward the peripheral edge 25. Preferably, the spacing between adjacent wave suppression features is on the order of $\lambda/10$. That is, the spacing interval is substantially less than one wavelength $\lambda$.

The peripheral openings 29 extend from the front surface 37 of the conductive layer 33, through the conductive layer 33 and the substrate 31, to a back surface 39 of the substrate 31. The peripheral openings 29 function to suppress surface waves propagating within the substrate 31 by providing a physical diffracting geometry. In a preferred embodiment, the peripheral openings 29 are metallized through-holes approximately 70 mils in diameter and spaced at intervals of approximately 150 mils.

Figure 3:
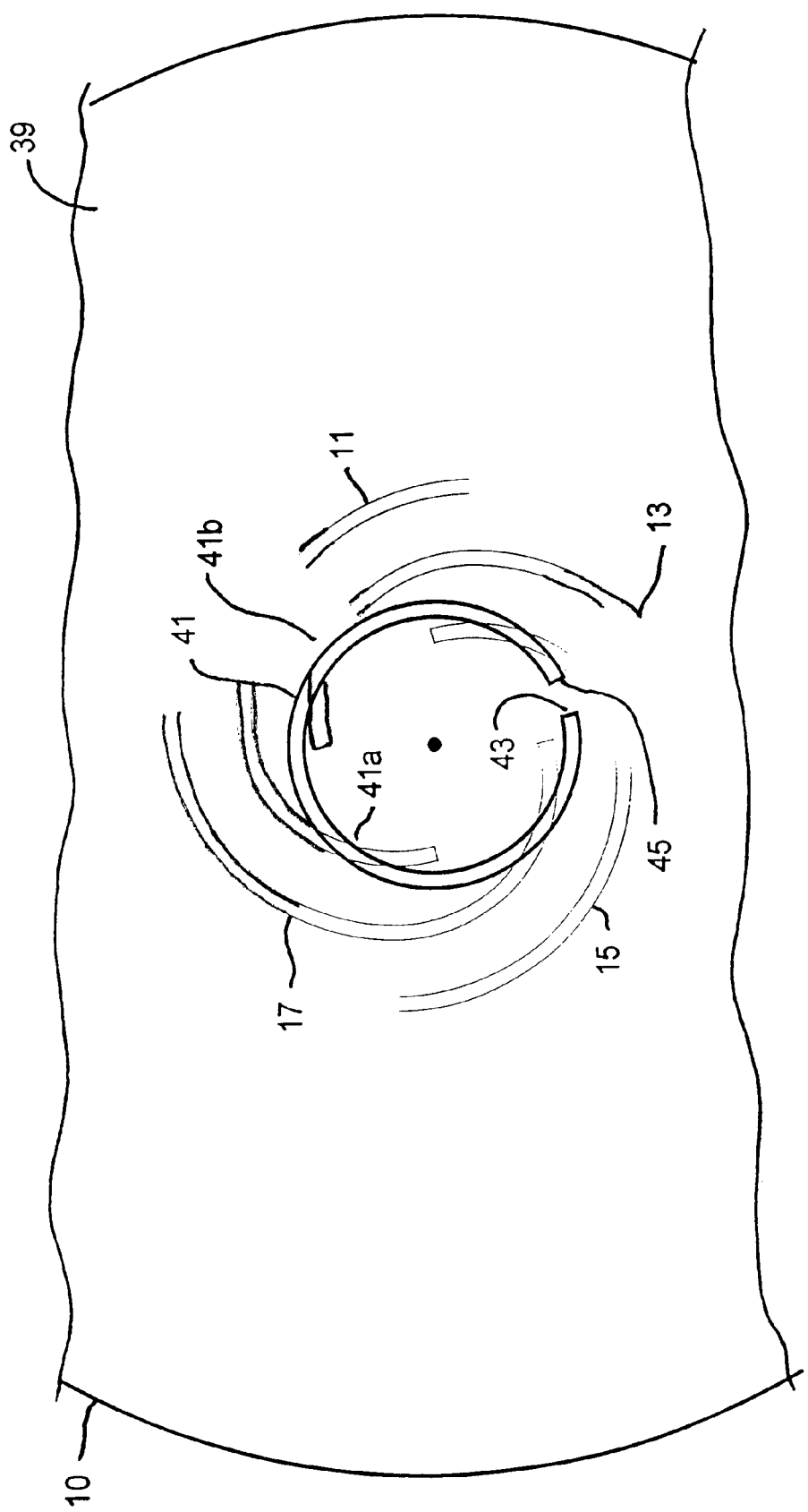
FIG. 3 is a diagrammatical view of a transmission line located on the rear surface of the antenna of FIG. 1.

A transmission line 41 is disposed on the back surface 39 of the substrate 31. As best shown in FIG. 3, which is a diagrammatical plan view of the back surface 39, the transmission line 41 is substantially circular with an input end 43, for receiving or outputting electromagnetic signals, and a terminal end 45 which may be electrically connected to a load impedance (not shown). The transmission line 41 is positioned on the back surface 39 so as to enclose the ends of the slotted openings 11, 13, 15, and 17 (here shown in phantom) and provide for coupling of electromagnetic energy between the transmission line 41 and the slotted openings 11, 13, 15, and 17. For example, the transmission line 41 overlaps the slotted opening 11 at region 41a, and overlaps the slotted opening 13 at region 41b. Accordingly, electromagnetic coupling between the transmission line 41 and the slotted opening 11 occurs primarily at the region 41a, and electromagnetic coupling between the transmission line 41 and the slotted opening 13 occurs primarily at the region 41b.

The transmission line 41 may comprise a microstrip, a coplanar waveguide, or other such conductive component as known in the relevant art. Preferably, the guided-wave length of the transmission line is substantially equal to one or more transmitted (or received) wavelengths $\lambda$. A transmission line having a guided wavelength of one $\lambda$ will produce a single omnidirectional beam emitted in the direction of the antenna axis 19 (i.e., normal to the plane of the antenna 10). Alternatively, a transmission line having a guided wavelength of $n\lambda$ will produce n beams equally spaced in the azimuth plane and whose primary angle in the vertical plane will depend on is the phase of excitation of the slotted openings 11, 13, 15, and 17.

The antenna 10 may thus be fabricated from a two-layer, or double-clad, printed circuit board (PCB), where the transmission line 41 and the slotted openings 11, 13, 15, and 17 can be formed by suitably etching portions of the respective cladding layers. As noted above, the preferred embodiment includes an array of twelve slotted openings spaced at intervals of 30°. However, in alternative embodiments, the slotted openings can be configured in varying shapes and lengths. For example, the slotted openings can be curved in shape as shown, straight segments, or a combination of both straight and curved segments. These alternative configurations are disclosed in commonly-assigned U.S. Pat. No. XXX, incorporated herein in its entirety by reference.

Figure 4:
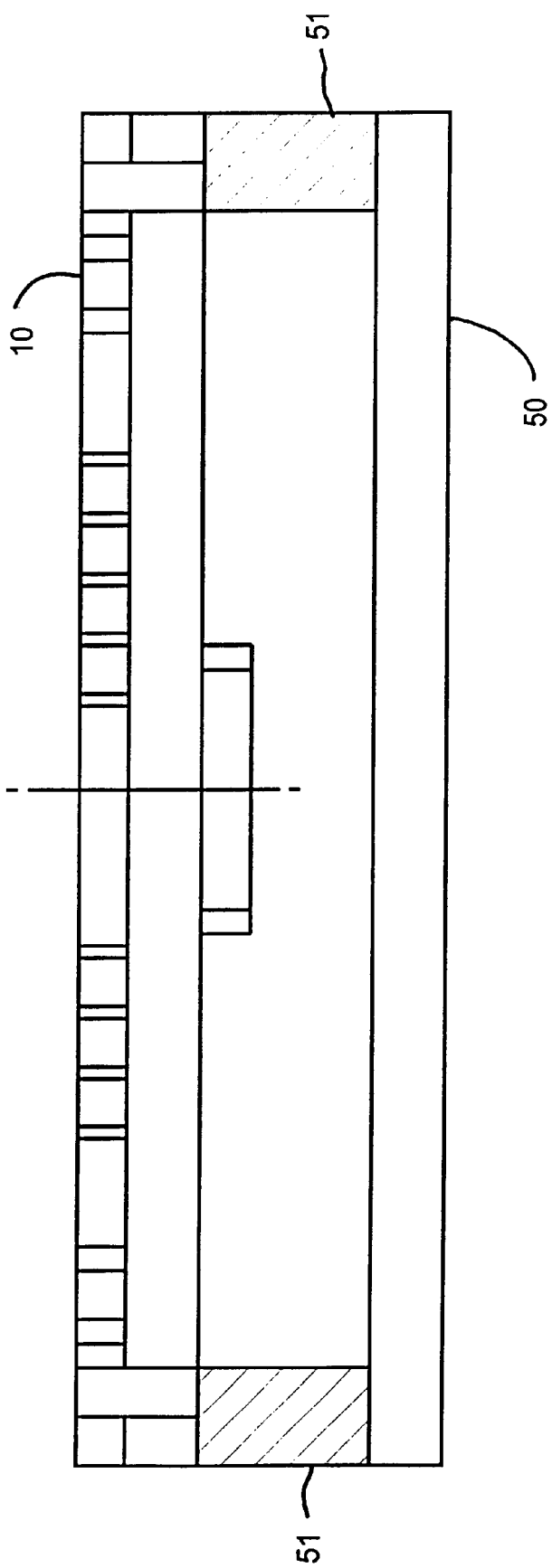

In an alternative embodiment, shown in FIG. 4, a reflector 50 is included adjacent to the antenna 10 and RF absorbing material 51 is emplaced in the region between the antenna 10 and the reflector 50. As can be appreciated by one skilled in the relevant art, use of the reflector 50 redirects in the forward direction the rearward radiation emitted by the antenna 10 to improve the antenna gain and reduce the back-lobe radiation.

While the invention has been described with reference to particular embodiments, it will be understood that the present invention is by no means limited to the particular constructions and methods herein disclosed and/or shown in the drawings, but also comprises any modifications or equivalents within the scope of the claims.

What is claimed is:

1. An antenna, suitable for transmitting and receiving electromagnetic signals of wavelength $\lambda$, said antenna comprising:
   a nonconductive substantially planar substrate having front and rear surfaces bounded by a common peripheral edge, said peripheral edge enclosing an antenna axis orthogonal to said front surface;
   a transmission line disposed on said rear surface;
   a conductive layer disposed on said front surface, said conductive layer including
   i. a plurality of slotted openings arrayed about said antenna axis, and
   ii. a surface-wave suppression region enclosing said array of slotted openings and attenuating surface waves propagating along said front surface from said slotted openings toward said peripheral edge; and
   a plurality of peripheral openings disposed between said surface-wave suppression region and said peripheral edge, said peripheral openings extending through said conductive layer and said substrate and attenuating surface waves propagating within said substrate by diffraction;
such that an electromagnetic signal fed into said transmission line is coupled sequentially into respective said slotted openings and transmitted from said slotted openings substantially in the direction of said antenna axis.

2. The antenna of claim 1 wherein said transmission line has a guided-wave length of at least $\lambda$.

3. The antenna of claim 1 wherein said transmission line is circular in shape so as to substantially enclose said antenna axis.

4. The antenna of claim 1 wherein said transmission line comprises a plurality of coupling regions, each said coupling region corresponding to one of said slotted openings.

5. The antenna of claim 1 wherein said surface-wave suppression region comprises a member of the group consisting of: photonic bandgap material and photonic crystal.

6. The antenna of claim 1 wherein said surface-wave suppression region comprises a plurality of concentric grooves.

7. The antenna of claim 6 wherein said concentric grooves are spaced at approximate intervals of $$\frac{\lambda}{10}.$$

8. The antenna of claim 1 wherein said antenna has an approximate diameter of 6.25 inches.

9. The antenna of claim 1 further comprising a reflector disposed adjacent said antenna and RF material disposed between said reflector and said antenna.

10. The antenna of claim 1 further comprising a reflector disposed adjacent said antenna and RF material disposed between said reflector and said antenna.

11. A method of transmitting an electromagnetic signal of wavelength λ, said method comprising the steps of:
- providing a nonconductive substantially planar substrate having front and rear surfaces bounded by a common peripheral edge, said peripheral edge enclosing an antenna axis orthogonal to said front surface;
- inputting the electromagnetic signal into a transmission line disposed on said rear surface;
- coupling the electromagnetic signal into a plurality of slotted openings arrayed about said antenna axis, said slotted openings formed in a conductive layer disposed on said front surface;
- attenuating surface waves propagating along said conductive layer by means of a surface-wave suppression region enclosing said slotted openings; and
- attenuating surface waves propagating through said substrate by means of a plurality of peripheral openings disposed between said surface-wave suppression region and said peripheral edge, said peripheral openings extending through said conductive layer and said substrate.

12. The method of claim 11 wherein said transmission line comprises a plurality of coupling regions, each said coupling region corresponding to one of said slotted openings.

13. The method of claim 11 wherein said surface-wave suppression region comprises a member of the group consisting of: photonic bandgap material and photonic crystal.

14. The method of claim 11 wherein said surface-wave suppression region comprises a plurality of concentric grooves.

15. An antenna, suitable for transmitting and receiving electromagnetic signals of wavelength λ, said antenna comprising:
- a nonconductive substantially planar substrate having front and rear surfaces bounded by a common peripheral edge, said peripheral edge enclosing an antenna axis orthogonal to said front surface;
- a transmission line disposed on said rear surface, said transmission line having a guided-wave length of at least λ;
- a conductive layer disposed on said front surface, said conductive layer including
  i. a plurality of slotted openings arrayed about said antenna axis, and
  ii. a surface-wave suppression region enclosing said array of slotted openings; and
- a plurality of closely spaced peripheral openings;
- disposed between said surface-wave suppression region and said peripheral edge, said peripheral openings extending through said conductive layer and said substrate;

such that an electromagnetic signal fed into said transmission line is coupled sequentially into respectived said slotted openings and transmitted from said slotted openings substantially in the direction of said antenna axis and surface waves propagation along said front surfaces from said slotted openings toward said peripheral edge are attenuated by said surface surface-wave suppression region and surface waves propagating within said substrate are attenuated by diffraction by said peripheral openings.

16. The antenna of claim 15 wherein said transmission line comprises twelve coupling regions, each said coupling region corresponding to one of said slotted openings.

17. The antenna of claim 15 wherein said surface-wave suppression region comprises a member of the group consisting of: photonic bandgap material and photonic crystal.

18. The antenna of claim 15 wherein said surface-wave suppression region comprises at least ten concentric grooves.

19. The antenna of claim 18 wherein said concentric grooves are spaced at approximate intervals of $$\frac{\lambda}{10}.$$

20. The antenna of claim 15 wherein said antenna has an approximate diameter of 6.25 inches.

21. An antenna, suitable for transmitting and receiving electromagnetic signal of wavelength λ, said antenna comprising:
- a nonconductive substantially planar substrate having front and rear a surfaces bounded by a common peripheral edge, said peripheral edge enclosing an antenna axis orthogonal to said front surface;
- a transmission line disposed on said rear surface;
- a conductive layer disposed on said front surface, said conductive layer including
  i. a plurality of slotted openings arrayed about said antenna axis such that an electromagnetic signal fed into said transmission line is coupled sequentially into respective said slotted openings and transmitted from said slotted openings substantially in the direction of said antenna axis, and
  ii. a surface-wave suppression region enclosing said array of slotted openings and attenuating surface waves propagating along said front surface from said slotted openings toward said peripheral edge.

22. The antenna of claim 21 wherein said surface-wave suppression region comprises a member of the group consisting of: photonic bandgap material and photonic crystal.

23. The antenna of claim 21 wherein said surface-wave suppression region comprises a plurality of concentric grooves.

24. The antenna of claim 21 wherein said concentric grooves are spaced at approximate intervals of no more than $$\frac{\lambda}{10}.$$

25. An antenna, suitable for transmitting and receiving electromagnetic signals of wavelength λ, said antenna comprising:
- a nonconductive substantially planar substrate having front and rear surfaces bounded by a common peripheral edge, said peripheral edge enclosing an antenna axis orthogonal to said front surface;
- a transmission line disposed on said rear surface;
- a conductive layer disposed on said front surface, said conductive layer including a plurality of slotted openings arrayed about said antenna axis such that an electromagnetic signal fed into said transmission line is coupled sequentially into respective said slotted openings and transmitted from said slotted openings substantially in the direction of said antenna axis; and
- a plurality of peripheral openings disposed between said slotted openings and said peripheral edge, said peripheral openings extending through said conductive layer and said substrate and attenuating surface waves within said substrate.

* * * * *